(12) United States Patent
Choi et al.

(10) Patent No.: US 12,247,141 B2
(45) Date of Patent: *Mar. 11, 2025

(54) POLISHING SLURRY COMPOSITION

(71) Applicant: KCTECH CO., LTD., Gyeonggi-do (KR)

(72) Inventors: Nak Hyun Choi, Gyeonggi-do (KR); Jung Yoon Kim, Gyeonggi-do (KR); Hae Won Yang, Seoul (KR); Soo Wan Choi, Seoul (KR)

(73) Assignee: KCTECH CO., LTD., Gyeonggi-do (KR)

( * ) Notice: Subject to any disclaimer, the term of this patent is extended or adjusted under 35 U.S.C. 154(b) by 597 days.

This patent is subject to a terminal disclaimer.

(21) Appl. No.: 17/415,704

(22) PCT Filed: Nov. 4, 2019

(86) PCT No.: PCT/KR2019/014782
§ 371 (c)(1),
(2) Date: Jun. 17, 2021

(87) PCT Pub. No.: WO2020/130332
PCT Pub. Date: Jun. 25, 2020

(65) Prior Publication Data
US 2022/0064488 A1    Mar. 3, 2022

(30) Foreign Application Priority Data
Dec. 21, 2018 (KR) .......................... 10-2018-0166901

(51) Int. Cl.
*C09G 1/02*    (2006.01)
*C09G 1/04*    (2006.01)
*B82Y 40/00*    (2011.01)
*H01L 21/304*    (2006.01)

(52) U.S. Cl.
CPC ............... *C09G 1/02* (2013.01); *C09G 1/04* (2013.01); *B82Y 40/00* (2013.01); *H01L 21/304* (2013.01)

(58) Field of Classification Search
None
See application file for complete search history.

(56) References Cited

U.S. PATENT DOCUMENTS

| | | | |
|---|---|---|---|
| 9,238,753 B2 * | 1/2016 | Reiss | C09K 3/1463 |
| 11,332,641 B2 * | 5/2022 | Shin | C09K 3/1463 |
| 11,384,255 B2 * | 7/2022 | Yang | C09K 3/14 |
| 2017/0183539 A1 * | 6/2017 | Kwon | H01L 21/3212 |
| 2017/0190936 A1 * | 7/2017 | Dockery | C09K 13/06 |
| 2019/0106596 A1 * | 4/2019 | Mishra | H01L 21/31053 |

FOREIGN PATENT DOCUMENTS

| | | |
|---|---|---|
| CN | 104284960 | 1/2015 |
| CN | 111492024 | 8/2020 |
| CN | 111511856 | 8/2020 |
| KR | 20050005543 | 1/2005 |
| KR | 20110040721 | 4/2011 |
| KR | 20110057876 | 6/2011 |
| KR | 20140133604 | 11/2014 |
| KR | 101483452 | 1/2015 |
| KR | 101737943 | 5/2017 |
| TW | 201504415 | 2/2015 |

OTHER PUBLICATIONS

"International Search Report (Form PCT/ISA/210) of PCT/KR2019/014782", with English translation thereof, mailed on Feb. 7, 2020, pp. 1-6.

* cited by examiner

*Primary Examiner* — Shamim Ahmed
(74) *Attorney, Agent, or Firm* — JCIPRNET

(57) ABSTRACT

The present invention relates to a polishing slurry composition. A polishing slurry composition according to an embodiment of the present disclosure comprises: a nonionic polymer having at least one amide bond; a selectivity control agent; and abrasive particles.

15 Claims, 1 Drawing Sheet

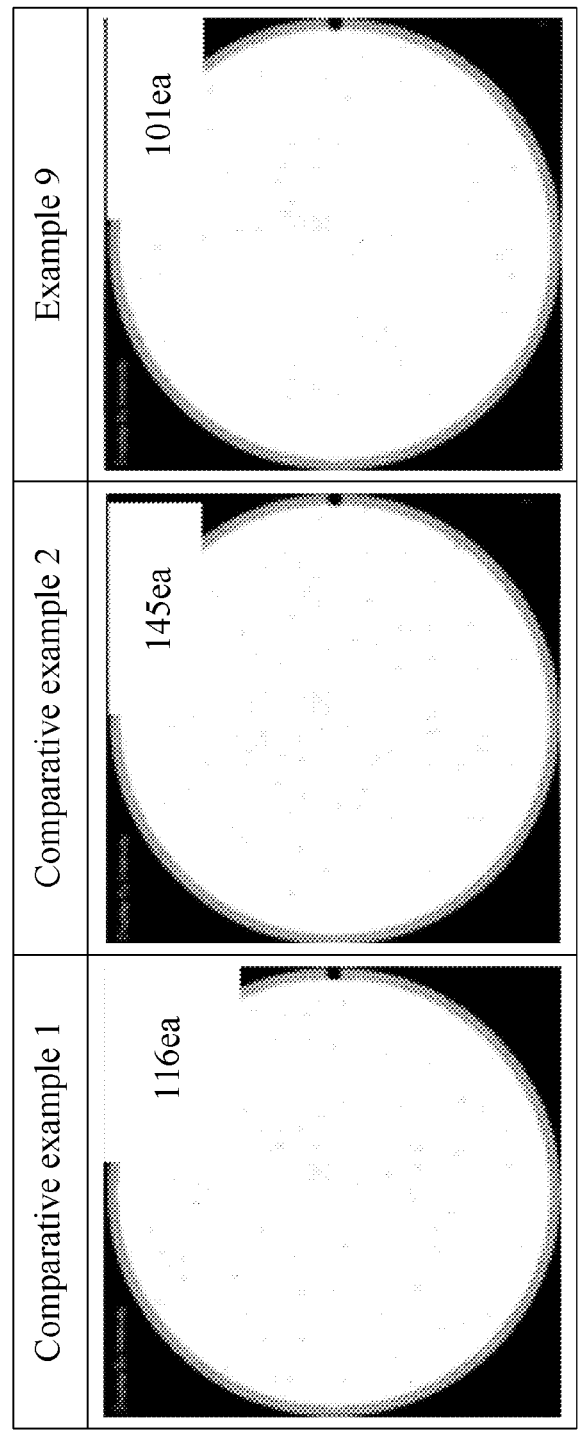

POLISHING SLURRY COMPOSITION

TECHNICAL FIELD

The present disclosure relates to a polishing slurry composition.

BACKGROUND ART

As semiconductor devices become more diversified and highly integrated, finer pattern formation techniques are being used, and accordingly a surface structure of semiconductor devices becomes more complicated and a step height of surface films also becomes greater. A chemical mechanical polishing (CMP) process is used as a planarization technique for removing a stepped portion of a specific film formed on a wafer in manufacturing of a semiconductor device. The CMP process is, for example, a process for removing an insulating film excessively formed for layer insulation, and is widely used as a process for planarizing an interlayer dielectric (ILD) and an insulating film for shallow trench isolation (STI) to insulate chips from each other and as a process for forming a metal conductive film, for example, a wiring, a contact plug, a via contact, and the like.

To protect a pattern polysilicon film in an STI process, a selective polishing characteristic of increasing a polishing rate of an insulating film layer and reducing a polishing rate of a polysilicon film layer is required. In particular, it is necessary to reduce a loss of a polysilicon film even during excessive polishing in a cell-type pattern.

Meanwhile, if a polishing selectivity in an STI process excessively increases, an insulating film layer buried in a trench may be excessively polished, which may lead to dishing and a decrease in a characteristic of a device. In particular, such dishing may result in a step difference between an active region and a field region in an ultra-micronized device, which may have a significant adverse influence on performance and reliability of the device.

DISCLOSURE OF INVENTION

Technical Goals

To solve the above-described problems, an aspect of the present disclosure is to provide a polishing slurry composition that may exhibit a high polishing rate for an insulating film, may inhibit polishing of a polysilicon film, may have a polishing stop function, a high polishing selectivity, and a function of inhibiting dishing from occurring after polishing during excessive polishing of a pattern wafer.

However, aspects of the present disclosure are not limited to the one set forth herein, and other aspects not mentioned herein would be clearly understood by one of ordinary skill in the art from the following description.

Technical Solutions

According to an aspect of the present disclosure, there is provided a polishing slurry composition including: a non-ionic (macromolecule) polymer having at least one amide bond; a selectivity control agent; and abrasive particles.

According to an example embodiment, the non-ionic (macromolecule) polymer may be represented by the following Chemical Formula 1:

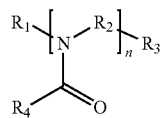

[Chemical Formula 1]

(In Chemical Formula 1, n is an integer greater than or equal to 1, $R_2$ is a simple bond and substituted or unsubstituted $C_{1-30}$ alkylene, alkenylene, cycloalkylene, arylene, arylalkylene, or alkynylene, and $R_1$, $R_3$, and $R_4$ are each independently hydrogen, a hydroxyl group, $C_{1-30}$ alkyl group, alkoxy group, aryl group or aralkyl group in which a functional group is substituted or unsubstituted.) According to an example embodiment, the non-ionic (macromolecule) polymer may include at least one selected from the group consisting of poly(2-methyl-2-oxazoline), poly(2-methyl-2-oxazoline) having a hydroxyl end, poly(2-methyl-2-oxazoline) having α-benzyl and co-azide end, poly(2-methyl-2-oxazoline) having an azide end, poly(2-methyl-2-oxazoline) having a piperazine end, poly(2-ethyl-2-oxazoline), poly(2-ethyl-2-oxazoline) having an alkyne end, poly(2-ethyl-2-oxazoline) having α-benzyl and ω-thiol end, poly(2-ethyl-2-oxazoline) having α-methyl and Co-2-hydroxyethylamine end, poly(2-ethyl-2-oxazoline) having an amine end, poly(2-ethyl-2-oxazoline) having a piperazine end, poly(2-propyl-2-oxazoline), poly(2-propyl-2-oxazoline) having an azide end, and derivatives thereof.

According to an example embodiment, the non-ionic (macromolecule) polymer may have a weight-average molecular weight of 5,000 to 500,000.

According to an example embodiment, the non-ionic (macromolecule) polymer may be present in an amount of 0.010% by weight (wt %) to 5 wt % in the polishing slurry composition.

According to an example embodiment, the selectivity control agent may include an organic acid containing an aromatic ring having 6 to 20 carbon atoms and at least one carboxyl group (—COOH).

According to an example embodiment, the selectivity control agent may include at least one selected from the group consisting of benzoic acid, phenylacetic acid, naphthoic acid, mandelic acid, picolinic acid, dipicolinic acid, nicotinic acid, dinicotinic acid, isonicotinic acid, quinolinic acid, anthranilic acid, fusaric acid, phthalic acid, isophthalic acid, terephthalic acid, toluic acid, salicylic acid, nitrobenzoic acid, and pyridinedicarboxylic acid.

According to an example embodiment, the selectivity control agent may be present in an amount of 0.01 wt % to 5 wt % in the polishing slurry composition.

According to an example embodiment, the polishing slurry composition may further include either one or both of a dispersion aid including a non-ionic polymer; and a polishing control agent including a cationic polymer.

According to an example embodiment, the dispersion aid may include at least one selected from the group consisting of polyethylene glycol, polypropylene glycol, polyvinylpyrrolidone, polyoxyalkylene alkyl ether, polyoxyalkylene alkyl ester, polyoxyethylene methyl ether, polyethylene glycol sulfonic acid, polyvinyl alcohol, polyethylene oxide, polypropylene oxide, polyalkyl oxide, polyoxyethylene oxide, a polyethylene oxide-propylene oxide copolymer, cellulose, methylcellulose, methylhydroxyethylcellulose, methylhydroxypropylcellulose, hydroxyethylcellulose, carboxymethylcellulose, carboxymethylhydroxyethylcellulose, sulfoethylcellulose, and carboxymethylsulfoethylcellulose.

According to an example embodiment, the dispersion aid may be present in an amount of 0.001 wt % to 1 wt % in the polishing slurry composition.

According to an example embodiment, the polishing control agent may include at least one selected from the group consisting of poly(2-methacryloxyethyltrimethylammonium chloride) (PMAC), poly(diallyldimethyl ammonium chloride); poly[bis(2-chloroethyl)ether-alt-1,3-bis[3-(dimethylamino)propyl]urea]; ethanol, 2,2',2''-nitrilotris-, polymer with 1,4-dichloro-2-butene and N,N,N',N'-tetramethyl-2-butenω-1,4-diamine; a hydroxyethyl cellulose dimethyl diallylammonium chloride copolymer; a copolymer of acrylamide and diallyldimethylammonium chloride; a copolymer of acrylamide and quaternized dimethylammoniumethyl methacrylate; a copolymer of acrylic acid and diallyldimethylammonium chloride; an acrylamide-dimethylaminoethyl methacrylate methyl chloride copolymer; quaternized hydroxyethyl cellulose; a copolymer of vinylpyrrolidone and quaternized dimethylaminoethyl methacrylate; a copolymer of vinylpyrrolidone and quaternized vinylimidazole; a copolymer of vinylpyrrolidone and methacrylamidopropyl trimethylammonium; poly(acrylamide 2-methacryloxyethyltrimethyl ammonium chloride); poly[2-(dimethylamino)ethyl methacrylate methyl chloride]; poly[3-acrylamidopropyl trimethylammonium chloride]; poly[3-methacrylamidopropyl trimethylammonium chloride]; poly[oxyethylene(dimethylimino)ethylene (dimethylimino)ethylene dichloride]; a terpolymer of acrylic acid, acrylamide and diallyldimethylammonium chloride; a terpolymer of acrylic acid, methacrylamidopropyl trimethylammonium chloride, and methyl acrylate; a terpolymer of vinylcaprolactam, vinylpyrrolidone, and quaternized vinylimidazole; poly(2-methacryloxyethyl phosphorylcholine-co-n-butyl methacrylate); poly[(dimethylamino)ethyl acrylate benzyl chloride quaternary salt (PDMAEA-BCQ); and poly[(dimethylamino)ethyl acrylate methyl chloride quaternary salt (PDMAEA-MCQ).

According to an example embodiment, the polishing control agent may be present in an amount of 0.001 wt % to 1 wt % in the polishing slurry composition.

According to an example embodiment, the abrasive particles may include at least one selected from the group consisting of a metal oxide, a metal oxide coated with an organic material or inorganic material, and the metal oxide in a colloidal phase, and the metal oxide may include at least one selected from the group consisting of silica, ceria, zirconia, alumina, titania, barium titania, germania, mangania, and magnesia.

According to an example embodiment, the abrasive particles may be prepared using a solid-phase method or a liquid-phase method, and may be dispersed so that surfaces of the abrasive particles may have positive charges.

According to an example embodiment, the abrasive particles may include a primary particle with a size of 5 nanometers (nm) to 150 nm and a secondary particle with a size of 30 nm to 300 nm.

According to an example embodiment, the abrasive particles may be present in an amount of 0.1 wt % to 10 wt % in the polishing slurry composition.

According to an example embodiment, pH of the polishing slurry composition may range from 3 to 6.

According to an example embodiment, the polishing slurry composition may further include water, and a ratio of the polishing solution:the water:an additive solution may be 1:3 to 10:1 to 10.

According to an example embodiment, the polishing slurry composition may have a zeta potential of +5 millivolts (mV) to +70 mV.

According to an example embodiment, in a shallow trench isolation (STI) process of a semiconductor device, a polishing selectivity of a silicon oxide film:a silicon nitride film may range from 2:1 to 30:1, and a polishing selectivity of a silicon oxide film:a polysilicon film may range from 2:1 to 20:1.

According to an example embodiment, an amount of dishing occurring in a silicon oxide film region after polishing the silicon nitride film or the polysilicon film may be less than or equal to 300 angstroms (Å).

Effects

By a polishing slurry composition of the present disclosure, it may be possible to reduce a loss of a polysilicon film even during excessive polishing in a cell-type pattern due to an excellent polishing stop function for the polysilicon film. Also, it may be possible to reduce an amount of dishing occurring in an insulating film during polishing of a pattern wafer. A high polishing rate for an insulating film, and an excellent planarization enhancement effect after polishing may be achieved. Thus, the polishing slurry composition may be applied to a shallow trench isolation (STI) process of a semiconductor device, thereby enabling manufacturing of a semiconductor device having more excellent reliability and characteristics.

BRIEF DESCRIPTION OF DRAWINGS

FIG. 1 is a photograph of defects on a surface of a wafer polished using the polishing slurry compositions of Comparative Examples 1 and 2, and Example 9 of the present disclosure.

BEST MODE FOR CARRYING OUT THE INVENTION

Hereinafter, example embodiments of the present disclosure will be described in detail with reference to the accompanying drawings. However, various alterations and modifications may be made to the example embodiments. Here, the example embodiments are not construed as limited to the disclosure and should be understood to include all changes, equivalents, and replacements within the idea and the technical scope of the disclosure.

The terminology used herein is for the purpose of describing particular example embodiments only and is not to be limiting of the example embodiments. As used herein, the singular forms "a", "an", and "the" are intended to include the plural forms as well, unless the context clearly indicates otherwise. It will be further understood that the terms "comprises/comprising" and/or "includes/including" when used herein, specify the presence of stated features, integers, steps, operations, elements, and/or components, but do not preclude the presence or addition of one or more other features, integers, steps, operations, elements, components and/or groups thereof.

Unless otherwise defined, all terms including technical and scientific terms used herein have the same meaning as commonly understood by one of ordinary skill in the art to which example embodiments belong. It will be further understood that terms, such as those defined in commonly-used dictionaries, should be interpreted as having a meaning that is consistent with their meaning in the context of the relevant art and will not be interpreted in an idealized or overly formal sense unless expressly so defined herein.

When describing the example embodiments with reference to the accompanying drawings, like reference numerals refer to like constituent elements and a repeated description related thereto will be omitted. In the description of example embodiments, detailed description of well-known related technologies will be omitted when it is deemed that such description will cause ambiguous interpretation of the present disclosure.

Hereinafter, a polishing slurry composition of the present disclosure will be described in detail with reference to example embodiments and drawings. However, the present disclosure is not limited to the example embodiments and drawings.

According to an aspect, a polishing slurry composition may include a non-ionic (macromolecule) polymer having at least one amide bond; a selectivity control agent; and abrasive particles.

By a polishing slurry composition of the present disclosure, it may be possible to reduce a loss of a polysilicon film even during excessive polishing in a cell-type pattern due to an excellent polishing stop function for the polysilicon film. Also, it may be possible to reduce an amount of dishing occurring in an insulating film during polishing of a pattern wafer. A high polishing rate for an insulating film, and an excellent planarization enhancement effect after polishing may be achieved. Thus, the polishing slurry composition may be applied to a shallow trench isolation (STI) process of a semiconductor device, thereby enabling manufacturing of a semiconductor device having more excellent reliability and characteristics.

According to an example embodiment, the non-ionic (macromolecule) polymer may be represented by the following Chemical Formula 1:

[Chemical Formula 1]

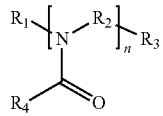

(In Chemical Formula 1, n is an integer greater than or equal to 1, $R_2$ is a simple bond and substituted or unsubstituted $C_{1-30}$ alkylene, alkenylene, cycloalkylene, arylene, arylalkylene, or alkynylene, and $R_1$, $R_3$, and $R_4$ are each independently hydrogen, a hydroxyl group, $C_{1-30}$ alkyl group, alkoxy group, aryl group or aralkyl group in which a functional group is substituted or unsubstituted.) According to an example embodiment, the non-ionic (macromolecule) polymer may include at least one selected from the group consisting of poly(2-methyl-2-oxazoline), poly(2-methyl-2-oxazoline) having a hydroxyl end, poly(2-methyl-2-oxazoline) having α-benzyl and co-azide end, poly(2-methyl-2-oxazoline) having an azide end, poly(2-methyl-2-oxazoline) having a piperazine end, poly(2-ethyl-2-oxazoline), poly(2-ethyl-2-oxazoline) having an alkyne end, poly(2-ethyl-2-oxazoline) having α-benzyl and ω-thiol end, poly(2-ethyl-2-oxazoline) having α-methyl and co-2-hydroxyethylamine end, poly(2-ethyl-2-oxazoline) having an amine end, poly(2-ethyl-2-oxazoline) having a piperazine end, poly(2-propyl-2-oxazoline), poly(2-propyl-2-oxazoline) having an azide end, and derivatives thereof.

According to an example embodiment, the non-ionic (macromolecule) polymer may have a weight-average molecular weight of 5,000 to 500,000. When the weight-average molecular weight is less than 5,000, performance of a film for protecting a polysilicon film may decrease, which may result in a decrease in a polishing selectivity and dishing performance. When the weight-average molecular weight exceeds 500,000, an aggregation phenomenon may occur, a number of defects may increase, a viscosity may increase, and storage stability of the polishing slurry composition may decrease.

According to an example embodiment, the non-ionic (macromolecule) polymer may be present in an amount of 0.01% by weight (wt %) to 5 wt % in the polishing slurry composition. When the amount of the non-ionic (macromolecule) polymer in the polishing slurry composition is less than 0.01 wt %, an automatic polishing stop function for the polysilicon film may not be implemented, and when the amount of the non-ionic (macromolecule) polymer is greater than or equal to 5 wt %, residues may be left because polishing is insufficiently performed by a polymer network.

According to an example embodiment, the selectivity control agent may refer to a compound that acts as a base for an acidic material and as an acid for a basic material.

According to an example embodiment, the selectivity control agent may include an organic acid containing an aromatic ring having 6 to 20 carbon atoms and at least one carboxyl group (—COOH). For example, in the organic acid, a carbon atom in the aromatic ring may be substituted with a nitrogen atom, and the organic acid may further include a nitro group, an amine group, a sulfonic acid group, a phosphoric acid group, an alkyl group, a hydroxyl group, and the like. More specifically, the organic acid may include at least one selected from the group consisting of benzoic acid, phenylacetic acid, naphthoic acid, mandelic acid, picolinic acid, dipicolinic acid, nicotinic acid, dinicotinic acid, isonicotinic acid, quinolinic acid, anthranilic acid, fusaric acid, phthalic acid, isophthalic acid, terephthalic acid, toluic acid, salicylic acid, nitrobenzoic acid, and pyridinedicarboxylic acid.

According to an example embodiment, the selectivity control agent may implement a desired selectivity by adjusting a polishing rate of a silicon nitride film, and may function to improve dishing. Also, the selectivity control agent may be used to adjust pH of the polishing slurry composition.

According to an example embodiment, the selectivity control agent may be added to the polishing slurry composition within a range of 0.01 wt % to 5 wt % as an appropriate amount to adjust the pH of the polishing slurry composition to be in a range of 3 to 6. When the amount of the selectivity control agent in the polishing slurry composition is less than 0.01 wt %, selective polishing performance of an oxide film, a nitride film and the polysilicon film may not appear, and accordingly it may be impossible to obtain a desired polishing selectivity. When the amount of the selectivity control agent exceeds 5 wt %, a long-term stability of the polishing slurry composition may decrease.

According to an example embodiment, the polishing slurry composition may further include either one or both of a dispersion aid including a non-ionic polymer; and a polishing control agent including a cationic polymer.

According to an example embodiment, the dispersion aid may include at least one selected from the group consisting of polyethylene glycol, polypropylene glycol, polyvinylpyrrolidone, polyoxyalkylene alkyl ether, polyoxyalkylene alkyl ester, polyoxyethylene methyl ether, polyethylene glycol sulfonic acid, polyvinyl alcohol, polyethylene oxide, polypropylene oxide, polyalkyl oxide, polyoxyethylene oxide, a polyethylene oxide-propylene oxide copolymer, cellulose, methylcellulose, methylhydroxyethylcellulose, methylhydroxypropylcellulose, hydroxyethylcellulose, carboxymethylcellulose, carboxymethylhydroxyethylcellulose, sulfoethylcellulose, and carboxymethylsulfoethylcellulose.

According to an example embodiment, the dispersion aid may be added to maintain dispersion stability of the polishing slurry composition, and may be present in an amount of 0.001 wt % to 1 wt % in the polishing slurry composition. When the amount of the dispersion aid is less than 0.001 wt %, an automatic polishing stop function for the polysilicon film may deteriorate, and when the amount of the dispersion aid exceeds 1 wt %, the dispersion aid may react in the polishing slurry composition, which may result in an aggregation phenomenon, and scratches may occur.

According to an example embodiment, the polishing control agent may include at least two ionized cations in a molecular formula, and may include at least two nitrogen atoms activated as cations. Accordingly, a viscosity of the cationic polymer may be adjusted. The cationic polymer may have a viscosity of 20 cp to 40 cp. Through adjustment of the viscosity, a nitride film polishing rate may be increased and an oxide film polishing rate may be controlled, to control a selectivity of an oxide film/a nitride film.

According to an example embodiment, the cationic polymer may be in a quaternary ammonium form.

According to an example embodiment, the polishing control agent may include at least one selected from the group consisting of poly(2-methacryloxyethyltrimethylammonium chloride) (PMAC), poly(diallyldimethyl ammonium chloride); poly[bis(2-chloroethyl)ether-alt-1,3-bis[3-(dimethylamino)propyl]urea]; ethanol, 2,2',2"-nitrilotris-, polymer with 1,4-dichloro-2-butene and N,N,N',N'-tetramethyl-2-butenω-1,4-diamine; a hydroxyethyl cellulose dimethyl diallylammonium chloride copolymer; a copolymer of acrylamide and diallyldimethylammonium chloride; a copolymer of acrylamide and quaternized dimethylammoniumethyl methacrylate; a copolymer of acrylic acid and diallyldimethylammonium chloride; an acrylamide-dimethylaminoethyl methacrylate methyl chloride copolymer; quaternized hydroxyethyl cellulose; a copolymer of vinylpyrrolidone and quaternized dimethylaminoethyl methacrylate; a copolymer of vinylpyrrolidone and quaternized vinylimidazole; a copolymer of vinylpyrrolidone and methacrylamidopropyl trimethylammonium; poly(acrylamide 2-methacryloxyethyltrimethyl ammonium chloride); poly[2-(dimethylamino)ethyl methacrylate methyl chloride]; poly[3-acrylamidopropyl trimethylammonium chloride]; poly[3-methacrylamidopropyl trimethylammonium chloride]; poly[oxyethylene(dimethylimino)ethylene (dimethylimino)ethylene dichloride]; a terpolymer of acrylic acid, acrylamide and diallyldimethylammonium chloride; a terpolymer of acrylic acid, methacrylamidopropyl trimethylammonium chloride, and methyl acrylate; a terpolymer of vinylcaprolactam, vinylpyrrolidone, and quaternized vinylimidazole; poly(2-methacryloxyethyl phosphorylcholine-co-n-butyl methacrylate); poly[(dimethylamino)ethyl acrylate benzyl chloride quaternary salt (PDMAEA-BCQ); and poly[(dimethylamino)ethyl acrylate methyl chloride quaternary salt (PDMAEA-MCQ).

According to an example embodiment, the polishing control agent may be present in an amount of 0.001 wt % to 1 wt % in the polishing slurry composition. When the amount of the polishing control agent in the polishing slurry composition is less than 0.001 wt %, it may be difficult to realize a desirable polishing selectivity. When the amount of the polishing control agent exceeds 1 wt %, an excessive polishing inhibition phenomenon may occur due to selective adsorption performance for a polishing film.

According to an example embodiment, the abrasive particles may include at least one selected from the group consisting of a metal oxide, a metal oxide coated with an organic material or inorganic material, and the metal oxide in a colloidal phase. The metal oxide may include at least one selected from the group consisting of silica, ceria, zirconia, alumina, titania, barium titania, germania, mangania, and magnesia.

According to an example embodiment, the abrasive particles may be ceria dispersed to have positive charges. The ceria dispersed to have positive charges may be mixed with an additive solution activated as positive charges, thereby implementing higher stepped portion removal performance and an automatic polishing stop function.

According to an example embodiment, the abrasive particles may be prepared by a solid-phase method or a liquid-phase method, and may be dispersed so that surfaces of the abrasive particles may have positive charges. The solid-phase method may include a method of calcinating abrasive particle precursors at a temperature of 400° C. to 1,000° C. Also, the liquid-phase method may include, for example, a sol-gel method of causing a chemical reaction of abrasive particle precursors in an aqueous solution and of growing crystals to obtain fine particles, or a coprecipitation method of precipitating abrasive particle ions in an aqueous solution, and a hydrothermal synthesis of forming abrasive particles at a high temperature under a high pressure.

According to an aspect, the abrasive particles may be single crystalline particles. When single crystalline abrasive particles are used, a scratch reduction effect may be achieved in comparison to polycrystalline abrasive particles, dishing may be improved, and cleanability after polishing may be enhanced.

According to an aspect, the abrasive particles may have at least one selected from the group consisting of a spherical shape, a square shape, a needle shape and a plate shape, and may desirably have the spherical shape.

According to an example embodiment, the abrasive particles may include a primary particle with a size of 5 nanometers (nm) to 150 nm and a secondary particle with a size of 30 nm to 300 nm. An average particle size of the abrasive particles may be measured as an average value of particle sizes of a plurality of particles within a field of view which may be measured by a scanning electron microscope analysis or dynamic light scattering. The size of the primary particle may need to be less than or equal to 150 nm to ensure a particle uniformity. When the size of the primary particle is less than nm, a polishing rate may decrease. In the size of the secondary particle in the polishing slurry composition, when the size of the secondary particle is less than 30 nm, and when small particles are excessively generated due to milling, cleanability may decrease, and an excess of defects may occur on a wafer surface. When the size of the secondary particle exceeds 300 nm, it may be difficult to adjust a selectivity due to excessive polishing, and dishing, erosion, and surface defects may be likely to occur.

According to an aspect, the abrasive particles may be mixed particles with a multi-dispersion type particle distribution, in addition to a single-size particle. For example, abrasive particles with two different types of average particle sizes may be mixed to have a bimodal particle distribution, or abrasive particles with three different types of average particle sizes may be mixed to have a particle size distribution showing three peaks. Also, abrasive particles with at least four different types of average particle sizes may be mixed to have a multi-dispersion type particle distribution. Relatively large abrasive particles and relatively small abrasive particles may be mixed, thereby obtaining more excellent dispersibility and expecting an effect of reducing a number of scratches on a wafer surface.

According to an example embodiment, the abrasive particles may be present in an amount of 0.1 wt % to 10 wt % in the polishing slurry composition. When the amount of the abrasive particles in the polishing slurry composition is less than 1 wt %, a polishing speed may decrease. When the amount of the abrasive particles exceeds 10 wt %, the polishing speed may significantly increase, and surface defects may be caused by adsorbability of particles remaining on a surface due to an increase in a number of abrasive particles.

According to an example embodiment, the pH of the polishing slurry composition may range from 3 to 6. When the pH of the polishing slurry composition is out of the above range, a dispersion stability may rapidly decrease and aggregation may occur.

According to an example embodiment, the polishing slurry composition may have a zeta potential of +5 millivolts (mV) to +70 mV. Due to positively charged abrasive particles, the polishing slurry composition may be a positive slurry composition that exhibits positive charges, and high dispersion stability may be maintained so that the abrasive particles may not aggregate, thereby inhibiting an occurrence of scratches.

The polishing slurry composition of the present disclosure may include water, desirably ultrapure water, deionized water, or distilled water, as a component other than the above components.

According to an example embodiment, a process of preparing the polishing slurry composition may include a concentration process and a dilution process.

According to an example embodiment, the polishing slurry composition may further include water; and a ratio of the polishing solution: the water: an additive solution may be 1:3 to 10:1 to 10. The water may include, for example, deionized water, ion-exchanged water and ultrapure water. When a proportion of the additive solution decreases in a range of 1 to 4, the polishing slurry composition may be suitable for use in polishing of a bulk and high stepped portion.

According to an example embodiment, the polishing slurry composition may be provided in a two-liquid form in which a polishing solution and an additive solution are separately prepared and mixed immediately before polishing, and also be provided in a one-liquid form in which a polishing solution and an additive solution are mixed. When the polishing slurry composition is used in the two-liquid form, no residue may be left in an STI pattern of a polysilicon film, dishing prevention performance may be enhanced, and a high selectivity may be achieved.

According to an example embodiment, in an STI process of a semiconductor device, a polishing selectivity of the silicon oxide film:the silicon nitride film may be 2:1 to 30:1, and a polishing selectivity of the silicon oxide film:the polysilicon film may be 2:1 to 20:1.

A polishing slurry composition for an STI process according to the present disclosure may include a non-ionic (macromolecule) polymer having at least one amide bond so that polishing on a surface of a polysilicon film may be inhibited, and thus the polishing slurry composition may have an automatic polishing stop function for the polysilicon film. Also, a loss of the polysilicon film may be reduced even though excessive polishing is performed in a cell-type pattern.

According to an example embodiment, an amount of dishing occurring in a silicon oxide film region after polishing the silicon nitride film or the polysilicon film may be less than or equal to 300 angstroms (Å). When the polishing slurry composition exhibits an excessively high polishing selectivity, the silicon oxide film region may be excessively polished in a process of using the polysilicon film as a polishing stop layer, which may lead to an increase in an amount of dishing. However, since the non-ionic (macromolecule) polymer having at least one amide bond is included, the amount of dishing may be reduced.

Hereinafter, the present disclosure will be described in detail with reference to examples and comparative examples. However, the technical idea of the present disclosure is not limited or restricted thereto.

[Polishing Conditions]
1. Polishing machine: AP-300 (300 mm, manufactured by KCTECH)
2. Pad: IC 1000 (manufactured by DOW)
3. Polishing time: 60 see
4. Platen RPM: 93 rpm
5. Spindle RPM: 87 rpm
6. Pressure: 3.5 psi
7. Flow rate: 250 ml/min
8. Used wafer: PE-TEOS 20K (A), STI poly pattern wafer 5000 K (A), Trench depth 5K (A)

Test Example 1: Polishing Performance of Polishing Slurry Composition According to Size of Abrasive Particles Example 1

5 wt % of colloidal ceria particles with a particle size of 30 nm, 0.5 wt % of poly(2-ethyl-2-oxazoline) having a weight-average molecular weight of 200,000 as a non-ionic (macromolecule) polymer, and 0.25 wt % of picolinic acid as a selectivity control agent were added and mixed, to prepare a polishing slurry composition with pH of 4.

Example 2

A polishing slurry composition was prepared in the same manner as in Example 1, except that colloidal ceria particles with a particle size of 40 nm was included instead of the colloidal ceria particles used in Example 1.

Example 3

A polishing slurry composition was prepared in the same manner as in Example 1, except that colloidal ceria particles with a particle size of 50 nm was included instead of the colloidal ceria particles used in Example 1.

Example 4

A polishing slurry composition was prepared in the same manner as in Example 1, except that colloidal ceria particles with a particle size of 60 nm was included instead of the colloidal ceria particles used in Example 1.

Polishing was performed under the above polishing conditions using the polishing slurry compositions of Examples 1 to 4.

Table 1 shows a removal rate (RR) of each of a silicon oxide film, a silicon nitride film, and a polysilicon film when a wafer is polished using the polishing slurry compositions of Examples 1 to 4.

TABLE 1

| | | Non-ionic (macromolecule) polymer | | Selectivity control agent | 300 mm CMP | | |
| | Abrasive | | | | Silicon oxide film | Silicon nitride film | Polysilicon film |
| Classification | particles | Mw | wt % | (wt %) | R.R | R.R | R.R |
|---|---|---|---|---|---|---|---|
| Example 1 | 30 nm | 200,000 | 0.5 | 0.25 | 325 | 15 | 27 |
| Example 2 | 40 nm | 200,000 | 0.5 | 0.25 | 1906 | 572 | 667 |
| Example 3 | 50 nm | 200,000 | 0.5 | 0.25 | 3179 | 954 | 1113 |
| Example 4 | 60 nm | 200,000 | 0.5 | 0.25 | 3374 | 1012 | 1181 |

Referring to Table 1, it may be confirmed that as the size of abrasive particles increases, a polishing rate increases.

Test Example 2: Polishing Performance of Polishing Slurry Composition According to Amount of Selectivity Control Agent Example 5

5 wt % of colloidal ceria particles with a particle size of 60 nm, 0.5 wt % of poly(2-ethyl-2-oxazoline) having a weight-average molecular weight of 50,000 as a non-ionic (macromolecule) polymer, and 0.15 wt % of picolinic acid as a selectivity control agent were added, to prepare a polishing slurry composition with pH of 4.

Example 6

A polishing slurry composition was prepared in the same manner as in Example 5, except that 0.25 wt % of picolinic acid was added instead of 0.15 wt % of picolinic acid used in Example 5.

Table 2 shows a removal rate (RR) of each of a silicon oxide film, a silicon nitride film, and a polysilicon film when a wafer is polished using the polishing slurry compositions of Examples 5 and 6.

TABLE 2

| | | Non-ionic (macromolecule) polymer | | Selectivity control agent | 300 mm CMP | | |
| | Abrasive | | | | Silicon oxide film | Silicon nitride film | Polysilicon film |
| Classification | particles | Mw | wt % | (wt %) | R.R | R.R | R.R |
|---|---|---|---|---|---|---|---|
| Example 5 | 60 nm | 50,000 | 0.5 | 0.15 | 3303 | 1024 | 1156 |
| Example 6 | 60 nm | 50,000 | 0.5 | 0.25 | 3682 | 852 | 1289 |

Referring to Table 2, it may be confirmed that when an amount of picolinic acid increases, a polishing rate for a nitride film decreases.

Test Example 3: Polishing Performance of Polishing Slurry Composition according to Amount of Polishing Control Agent Example 7

5 wt % of colloidal ceria particles with a particle size of 60 nm, 0.5 wt % of poly(2-ethyl-2-oxazoline) having a weight-average molecular weight of 50,000 as a non-ionic (macromolecule) polymer, and 0.5 wt % of picolinic acid as a selectivity control agent were added, to prepare a polishing slurry composition with pH of 4.

Example 8

A polishing slurry composition was prepared in the same manner as in Example 7, except that 0.005 wt % of poly(2-methacryloxyethyltrimethylammonium chloride) (PMAC) as a polishing control agent was further added to Example 7.

Example 9

A polishing slurry composition was prepared in the same manner as in Example 8, except that poly(2-ethyl-2-oxazoline) having a weight-average molecular weight of 200,000 as a non-ionic (macromolecule) polymer was further added to Example 8.

Table 3 shows a removal rate (RR) of each of a silicon oxide film, a silicon nitride film, and a polysilicon film when a wafer is polished using the polishing slurry compositions of Examples 7 to 9.

TABLE 3

| Classification | Abrasive particles | Non-ionic (macromolecule) polymer Mw | wt % | Selectivity control agent (wt %) | Polishing control agent (wt %) | 300 mm CMP | | |
|---|---|---|---|---|---|---|---|---|
| | | | | | | Silicon oxide film R.R | Silicon nitride film R.R | Polysilicon film R.R |
| Example 7 | 60 nm | 50,000 | 0.5 | 0.5 | 0.0 | 4524 | 989 | 680 |
| Example 8 | 60 nm | 50,000 | 0.5 | 0.5 | 0.005 | 4793 | 1189 | 780 |
| Example 9 | 60 nm | 200,000 | 0.5 | 0.5 | 0.005 | 4665 | 1226 | 552 |

Referring to Table 3, it may be confirmed that a polishing rate for a nitride film increases because PMAC was added as a polishing control agent.

Test Example 4: Wafer Defects According to Type of Abrasive Particles

Comparative Example 1

5 wt % of colloidal ceria particles with a particle size of 60 nm and 0.5 wt % of poly(2-ethyl-2-oxazoline) having a weight-average molecular weight of 50,000 as a non-ionic (macromolecule) polymer were mixed without addition of a picolinic acid as a selectivity control agent, to prepare a polishing slurry composition with pH of 5.

Comparative Example 2

After dispersing abrasive particles by adding a polyacrylic acid as a dispersant to ceria abrasive particles prepared by a solid phase method, ammonia was added, to prepare an anionic slurry composition with pH of 8.

Table 4 shows a removal rate (RR) of each of a silicon oxide film, a silicon nitride film, and a polysilicon film when a wafer is polished using the slurry compositions of Comparative Examples 1 and 2 and the polishing slurry composition of Example 9.

Defects of Comparative Examples 1 and 2 and Example 9 were measured.

A cleaning process was performed for 15 seconds using standard cleaning 1 (SC-1) that is a mixed cleaning solution of ammonia water, hydrogen peroxide, and water, and then was performed for 30 seconds using HF. ATI-XP was used as defect measurement equipment.

FIG. 1 is a photograph of defects on a surface of a wafer polished using the polishing slurry compositions of Comparative Examples 1 and 2, and Example 9 of the present disclosure. "116" defects for Comparative Example 1, "145" defects for Comparative Example 2, and "101" defects for Example 9 appear. In other words, a polishing slurry composition for an STI process according to the present disclosure may include colloidal ceria particles, and a cationic polishing slurry composition including a polymer having an amide bond may be used, and accordingly polishing on a surface of a polysilicon film may be inhibited. Thus, the polishing slurry composition may have an automatic polishing stop function for the polysilicon film, may obtain high polishing rates for a silicon oxide film and a silicon nitride film, may inhibit polishing of the polysilicon film layer, and may protect a pattern polysilicon film.

While this disclosure includes specific example embodiments, it will be apparent to one of ordinary skill in the art that various changes in form and details may be made in these example embodiments without departing from the spirit and scope of the claims and their equivalents. The example embodiments described herein are to be considered in a descriptive sense only, and not for purposes of limitation. Descriptions of features or aspects in each example embodiment are to be considered as being applicable to similar features or aspects in other example embodiments. Suitable results may be achieved if the described techniques are performed in a different order, and/or if components in a described system, architecture, device, or circuit are combined in a different manner, and/or replaced or supplemented by other components or their equivalents.

TABLE 4

| Classification | Abrasive particles | Non-ionic (macromolecule) polymer Mw | Wt % | Selectivity control agent (wt %) | Dispersion aid (wt %) | Polishing control agent (wt %) | Zeta potential (mV) | 300 mm CMP | | |
|---|---|---|---|---|---|---|---|---|---|---|
| | | | | | | | | Silicon oxide film R.R | Silicon nitride film R.R | Poly silicon film R.R |
| Comp. Ex. 1 | 60 nm | 50,000 | 0.5 | — | — | — | +50 | 4189 | 26 | 38 |
| Comp. Ex. 2 | Solid phase method | — | — | — | — | — | −40 | 3738 | 594 | 1848 |
| Ex. 9 | 60 nm | 200 | 0.5 | 0.5 | — | 0.1 | +54 | 4665 | 1226 | 552 |

The invention claimed is:

1. A polishing slurry composition comprising:
   a non-ionic macromolecule polymer having at least one amide bond;
   a selectivity control agent; and
   abrasive particles,
   wherein the abrasive particles are prepared using a solid-phase method or a liquid-phase method, and are dispersed so that surfaces of the abrasive particles have positive charges,
   wherein the polishing slurry composition has a zeta potential of +5 millivolts (mV) to +70 mV,
   pH of the polishing slurry composition ranges from 3 to 6,
   wherein the non-ionic macromolecule polymer is represented by the following Chemical Formula 1:

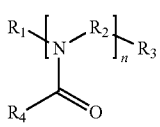

[Chemical Formula 1]

(In Chemical Formula 1, n is an integer greater than or equal to 2, $R_2$ is a simple bond and substituted or unsubstituted $C_{1-30}$ alkylene, alkenylene, cycloalkylene, arylene, arylalkylene, or alkynylene, and $R_1$, $R_3$, and $R_4$ are each independently hydrogen, a hydroxyl group, $C_{1-30}$ alkyl group, alkoxy group, aryl group or aralkyl group in which a functional group is substituted or unsubstituted),
   wherein the non-ionic macromolecule polymer is present in an amount greater than 0.1% by weight (wt %) and less than or equal to 5 wt % in the polishing slurry composition, and
   wherein in a shallow trench isolation (STI) process of a semiconductor device,
   a polishing selectivity of a silicon oxide film:a silicon nitride film ranges from 2:1 to 30:1, or
   a polishing selectivity of a silicon oxide film:a polysilicon film ranges from 2:1 to 20:1.

2. The polishing slurry composition of claim 1, wherein the non-ionic macromolecule polymer comprises at least one selected from the group consisting of poly(2-methyl-2-oxazoline), poly(2-methyl-2-oxazoline) having a hydroxyl end, poly(2-methyl-2-oxazoline) having α-benzyl and ω-azide end, poly(2-methyl-2-oxazoline) having an azide end, poly(2-methyl-2-oxazoline) having a piperazine end, poly(2-ethyl-2-oxazoline), poly(2-ethyl-2-oxazoline) having an alkyne end, poly(2-ethyl-2-oxazoline) having α-benzyl and ω-thiol end, poly(2-ethyl-2-oxazoline) having α-methyl and ω-2-hydroxyethylamine end, poly(2-ethyl-2-oxazoline) having an amine end, poly(2-ethyl-2-oxazoline) having a piperazine end, poly(2-propyl-2-oxazoline), poly(2-propyl-2-oxazoline) having an azide end, and derivatives thereof.

3. The polishing slurry composition of claim 1, wherein the non-ionic macromolecule polymer has a weight-average molecular weight of 5,000 to 500,000.

4. The polishing slurry composition of claim 1, wherein the selectivity control agent comprises an organic acid containing an aromatic ring having 6 to 20 carbon atoms and at least one carboxyl group (—COOH).

5. The polishing slurry composition of claim 4, wherein the selectivity control agent comprises at least one selected from the group consisting of benzoic acid, phenylacetic acid, naphthoic acid, mandelic acid, picolinic acid, dipicolinic acid, nicotinic acid, dinicotinic acid, isonicotinic acid, quinolinic acid, anthranilic acid, fusaric acid, phthalic acid, isophthalic acid, terephthalic acid, toluic acid, salicylic acid, nitrobenzoic acid, and pyridinedicarboxylic acid.

6. The polishing slurry composition of claim 1, wherein the selectivity control agent is present in an amount of 0.01 wt % to 5 wt % in the polishing slurry composition.

7. The polishing slurry composition of claim 1, further comprising either one or both of:
   a dispersion aid comprising a non-ionic polymer; and
   a polishing control agent comprising a cationic polymer.

8. The polishing slurry composition of claim 7, wherein the dispersion aid comprises at least one selected from the group consisting of
   polyethylene glycol, polypropylene glycol, polyvinylpyrrolidone, polyoxyalkylene alkyl ether, polyoxyalkylene alkyl ester, polyoxyethylene methyl ether, polyethylene glycol sulfonic acid, polyvinyl alcohol, polyethylene oxide, polypropylene oxide, polyalkyl oxide, polyoxyethylene oxide, a polyethylene oxide-propylene oxide copolymer, cellulose, methylcellulose, methylhydroxyethylcellulose, methylhydroxypropylcellulose, hydroxyethylcellulose, carboxymethylcellulose, carboxymethylhydroxyethylcellulose, sulfoethylcellulose, and carboxymethylsulfoethylcellulose.

9. The polishing slurry composition of claim 7, wherein the dispersion aid is present in an amount of 0.001 wt % to 1 wt % in the polishing slurry composition.

10. The polishing slurry composition of claim 7, wherein the polishing control agent comprises at least one selected from the group consisting of
   poly(2-methacryloxyethyltrimethylammonium chloride) (PMAC), poly(diallyldimethyl ammonium chloride); poly[bis(2-chloroethyl)ether-alt-1,3-bis[3-(dimethylamino)propyl]urea]; ethanol, 2,2',2"-nitrilotris-, polymer with 1,4-dichloro-2-butene and N,N,N',N'-tetramethyl-2-butenω-1,4-diamine; a hydroxyethyl cellulose dimethyl diallylammonium chloride copolymer; a copolymer of acrylamide and diallyldimethylammonium chloride; a copolymer of acrylamide and quaternized dimethylammoniumethyl methacrylate; a copolymer of acrylic acid and diallyldimethylammonium chloride; an acrylamide-dimethylaminoethyl methacrylate methyl chloride copolymer; quaternized hydroxyethyl cellulose; a copolymer of vinylpyrrolidone and quaternized dimethylaminoethyl methacrylate; a copolymer of vinylpyrrolidone and quaternized vinylimidazole; a copolymer of vinylpyrrolidone and methacrylamidopropyl trimethylammonium; poly(acrylamide 2-methacryloxyethyltrimethyl ammonium chloride); poly[2-(dimethylamino)ethyl methacrylate methyl chloride]; poly[3-acrylamidopropyl trimethylammonium chloride]; poly[3-methacrylamidopropyl trimethylammonium chloride]; poly[oxyethylene(dimethylimino)ethylene (dimethylimino)ethylene dichloride]; a terpolymer of acrylic acid, acrylamide and diallyldimethylammonium chloride; a terpolymer of acrylic acid, methacrylamidopropyl trimethylammonium chloride, and methyl acrylate; a terpolymer of vinylcaprolactam, vinylpyrrolidone, and quaternized vinylimidazole; poly (2-methacryloxyethyl phosphorylcholine-co-n-butyl methacrylate); poly[(dimethylamino)ethyl acrylate benzyl chloride quaternary salt (PDMAEA-BCQ); and poly[(dimethylamino)ethyl acrylate methyl chloride quaternary salt (PDMAEA-MCQ).

11. The polishing slurry composition of claim 7, wherein the polishing control agent is present in an amount of 0.001 wt % to 1 wt % in the polishing slurry composition.

12. The polishing slurry composition of claim 1, wherein
the abrasive particles comprise at least one selected from the group consisting of a metal oxide, a metal oxide coated with an organic material or inorganic material, and the metal oxide in a colloidal phase,
the metal oxide comprises at least one selected from the group consisting of silica, ceria, zirconia, alumina, titania, barium titania, germania, mangania, and magnesia, and
the abrasive particles are present in an amount of 0.1 wt % to 10 wt % in the polishing slurry composition.

13. The polishing slurry composition of claim 1, wherein the abrasive particles comprise a primary particle with a size of 5 nanometers (nm) to 150 nm and a secondary particle with a size of 30 nm to 300 nm.

14. The polishing slurry composition of claim 1, further comprising:
water,
wherein a ratio of the polishing solution:the water:an additive solution is 1:3 to 10:1 to 10.

15. The polishing slurry composition of claim 1, wherein an amount of dishing occurring in a silicon oxide film region after polishing the silicon nitride film or the polysilicon film is less than or equal to 300 angstroms (Å).

* * * * *